(12) United States Patent
Harada et al.

(10) Patent No.: US 6,511,885 B2
(45) Date of Patent: Jan. 28, 2003

(54) VERTICAL MOS TRANSISTOR AND METHOD OF MANUFACTURING THE SAME

(75) Inventors: Hirofumi Harada, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/767,505

(22) Filed: Jan. 23, 2001

(65) Prior Publication Data

US 2001/0023959 A1 Sep. 27, 2001

(30) Foreign Application Priority Data

Mar. 22, 2000 (JP) ........................................ 2000-080755

(51) Int. Cl.⁷ ............................................ H01L 21/336
(52) U.S. Cl. .................... 438/270; 438/416; 438/589
(58) Field of Search ................................. 438/138, 268, 438/270, 416, 424, 430, 589, 981

(56) References Cited

U.S. PATENT DOCUMENTS

| | | | | |
|---|---|---|---|---|
| 4,992,390 A | * | 2/1991 | Chang | ........................ 438/270 |
| 5,473,176 A | * | 12/1995 | Kakumoto | .................... 438/270 |
| 5,578,522 A | * | 11/1996 | Nakamura et al. | .......... 438/270 |
| 6,198,127 B1 | * | 3/2001 | Kocon | .......................... 257/328 |

* cited by examiner

Primary Examiner—Chandra Chaudhari
(74) Attorney, Agent, or Firm—Adams & Wilks

(57) ABSTRACT

There are provided a vertical MOS transistor in which a high frequency characteristic is improved by reducing a feedback capacitance, and a method of manufacturing the same. When a gate voltage is applied to a gate electrode, a channel is formed in a p– epitaxial growth layer along a trench, and an electron current flows from an n+ drain layer to the p– epitaxial growth layer. In this case, an overlapping area between a gate and the drain layer through a gate oxide film is smaller than prior art, and the capacitance between the gate and the drain layer is smaller than the prior art. Thus, the feedback capacitance becomes small and the high frequency characteristic is improved. Further, since a portion of the gate oxide film at the bottom of the trench is thicker than the portion at the side wall, the distance between the gate and the n+ semiconductor substrate becomes larger than the prior art, and the capacitance formed between the gate and the n+ semiconductor substrate is smaller than the prior art. Thus, the high frequency characteristic is improved as compared with the prior art.

19 Claims, 12 Drawing Sheets

VERTICAL MOS TRANSISTOR AND METHOD OF MANUFACTURING THE SAME

BACKGROUND OF THE INVENTION

1. Field of the Invention

The present invention relates to a vertical MOS transistor in which a high frequency characteristic is improved as compared with the prior art vertical MOS transistor by lowering feedback capacitance, and a method of manufacturing the same.

2. Description of the Related Art

FIG. 2 is a schematic sectional view showing an example of a conventional vertical MOS transistor.

This vertical MOS transistor includes an n+ semiconductor substrate 1. A drain electrode 1a is connected to the n+ semiconductor substrate 1. An n− epitaxial growth layer 2 is formed on the n+ semiconductor substrate 1. A p− body region 3 is formed on the n+ epitaxial growth layer 2. Further, a trench 4 is formed so as to reach the inside of the n− epitaxial growth layer 2 through the p− body region 3, and a gate oxide film 5 is formed along the wall surface of the trench 4. A gate 6 of polycrystalline silicon is filled in the trench 4 so as to be surrounded by the gate oxide film 5. A gate electrode 6a is connected to the gate 6. An n+ source layer 7 is formed on the surface of the p− body region 3 and at the periphery of the trench 4. A source electrode 7a is connected to the n+ source layer 7. A p+diffusion region 8 is formed on the surface of the p− body region 3 and at a region separate from the n+ source layer 7. A body electrode 8a is connected to the p+ diffusion region 8.

In this vertical MOS transistor, when a gate voltage is applied through the gate electrode 6a, a channel is formed along the trench 4 in the p− body region 3, and an electron current flows from the n+ source layer 7 to the n− epitaxial growth layer 2.

However, the conventional vertical MOS transistor of FIG. 2 has various problems, as follows:

In the vertical MOS transistor of FIG. 2, a large area of overlap exists between the gate 6 and the n+ semiconductor substrate 1 serving as a drain through the gate oxide film 5, and a large capacitance is formed between the gate 6 and the n+ semiconductor substrate 1. Thus, in the case where the conventional vertical MOS transistor is used as, for example, a source grounded circuit, since a reverse phase output voltage to an input gate voltage is applied through the feedback capacitance, there has been a problem in that the high frequency characteristic of voltage amplification is inhibited. In order to solve this problem, there is generally taken a countermeasure to lessen the influence of the feedback capacitance by making a cascade connection of a gate grounded circuit to the source grounded circuit. However, when the gate grounded circuit is added, the number of parts increases and the circuit becomes more complicated.

Further, the vertical MOS transistor of FIG. 2 has a problem as shown in FIGS. 3A and 3B.

FIGS. 3A and 3B are structural views of a case where a metal contact pattern M is provided in the vertical MOS transistor of FIG. 2, FIG. 3A is a plan view and FIG. 3B is a sectional view taken along line A–A' of FIG. 3A.

As shown in FIG. 3B, in the case where the n+ source layer 7 is connected to the p+ diffusion region 8 through the metal contact pattern M, it is necessary that the contact pattern M is formed to be larger than the p+ diffusion region 8, and further, it is necessary that the contact pattern is formed in view of the margin including a positional deviation at patterning as well. Thus, as shown in FIG. 3A, there has been a problem that a lattice pattern becomes inevitably large, and miniaturization is difficult.

SUMMARY OF THE INVENTION

In order to solve the above-mentioned problems, according to the present invention, a vertical MOS transistor includes a semiconductor substrate of a first conductivity type, a first epitaxial growth layer of a second conductivity type formed on the semiconductor substrate, a second epitaxial growth layer of the first conductivity type formed on the first epitaxial growth layer, a trench formed so as to reach the inside of the semiconductor substrate through the second epitaxial growth layer and the first epitaxial growth layer, a gate oxide film formed along the surface of the second epitaxial growth layer and the wall surface of the trench, a gate which is filled in the trench so as to be surrounded by the gate oxide film and which has its upper portion coincident with an upper portion of the first epitaxial growth layer, a drain layer of the first conductivity type formed on the surface of the second epitaxial growth layer and at the periphery of the trench, a gate electrode connected to the gate, a drain electrode connected to the drain layer, and a source electrode connected to the semiconductor substrate.

By this, a positional relation between the drain layer and the source layer with respect to the gate comes to have an opposite structure to the prior art, and an overlapping area between the gate and the drain layer through the gate oxide film becomes small. Thus, the capacitance formed between the gate and the drain becomes smaller than the prior art, and the feedback capacitance becomes smaller than the prior art.

A method of manufacturing a vertical MOS transistor comprises a first epitaxial growth layer formation step of forming a first epitaxial growth layer of a second conductivity type on a semiconductor substrate of a first conductivity type, a second epitaxial growth layer formation step of forming a second epitaxial growth layer of the first conductivity type on the first epitaxial growth layer, a trench formation step of forming a trench by performing an anisotropic etching from a trench formation scheduled region on the second epitaxial growth layer through the second epitaxial growth layer and the first epitaxial growth layer to the inside of the semiconductor substrate, a gate oxide film formation step of forming a gate oxide film along a surface of the second epitaxial growth layer and a wall surface of the trench, a polycrystalline silicon layer deposit step of depositing a polycrystalline silicon layer on the gate oxide film, a gate formation step of forming a gate in the trench by performing an arbitrary amount of etching to the polycrystalline silicon layer, its upper portion being coincident with an upper portion of the first epitaxial growth layer, and a drain layer formation step of, forming a drain layer of the first conductivity type on the surface of the second epitaxial growth layer and at the periphery of the trench.

DETAILED DESCRIPTION OF THE PREFERRED EMBODIMENTS

First Embodiment

Figure 1:
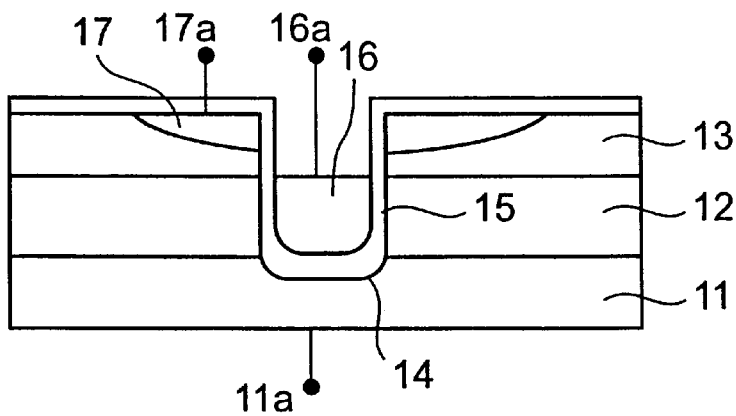
FIG. 1 is a sectional view of a vertical MOS transistor of a first embodiment of the present invention.
Figure 2:
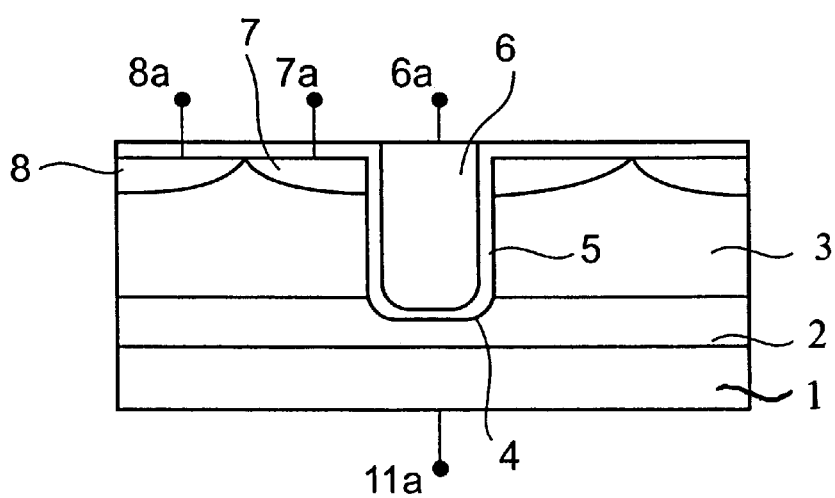
FIG. 2 is a sectional view of a conventional vertical MOS transistor.

FIG. 1 is a schematic sectional view of a vertical MOS transistor of a first embodiment of the present invention.

This vertical MOS transistor includes an n+ semiconductor substrate 11 of a first conductivity type. A source electrode 11a is connected to the n+ semiconductor substrate 11. A first epitaxial growth layer 12 of a second conductivity type (for example, p– epitaxial growth layer) is formed on the n+ semiconductor substrate 11. A second epitaxial growth layer 13 of the first conductivity type (for example, n– epitaxial growth layer) is formed on the p– epitaxial growth layer 12. Further, a trench 14 is formed into a U shape so as to reach the inside of the n+ semiconductor substrate 11 through the n– epitaxial growth layer 13 and the p– epitaxial growth layer 12, and a gate oxide film 15 is formed along the wall surface of the trench 14 and the surface of the n– epitaxial growth layer 13. In the gate oxide film 15, a portion formed along the bottom of the trench 14 is formed to be thicker, by enhanced oxidation on the n+ semiconductor substrate 11, than a portion formed along the side wall. Then a gate 16 of polycrystalline silicon is filled in the trench 14 so as to be surrounded by the gate oxide film 15. The gate 16 is removed so that its upper portion becomes coincident with an upper portion of the p– epitaxial growth layer. A gate electrode 16a is connected to the gate 16. A drain layer 17 of the first conductivity type (for example, n+ drain layer) is formed on the surface of the n– epitaxial growth layer 13 and at the periphery of the trench 14. A drain electrode 17a is connected to the n+ drain layer 17.

In this vertical MOS transistor, when a gate voltage is applied from the gate electrode 16a, a channel is formed in the p– epitaxial growth layer 12 along the trench 14, and an electron current flows from the n+ drain layer 17 to the p– epitaxial growth layer 12. In this case, an overlapping area between the gate 16 and the drain layer 17 through the gate oxide film 15 is smaller than the prior art, and capacitance formed between the gate 16 and the drain 17 is smaller than the prior art. Thus, in the case where this vertical MOS transistor is used as, for example, a source grounded circuit, since feedback capacitance is small, a high frequency characteristic of voltage amplification is improved as compared with the prior art. Further, since the portion of the gate oxide film 15 formed along the bottom of the trench 14 is formed to be thicker than the portion formed along the side wall, a distance between the gate 16 and the n+ semiconductor substrate 11 is larger than the prior art, and capacitance formed between the gate 16 and the n+ semiconductor substrate 11 is smaller than the prior art. Thus the high frequency characteristic of voltage amplification is improved as compared with the prior art.

FIGS. 4A to 4E are process views for explaining a method of manufacturing the vertical MOS transistor of FIG. 1.

With reference to the drawings; manufacturing processes (1) to (5) of the vertical MOS transistor of FIG. 1 will be described.

Figure 4A:
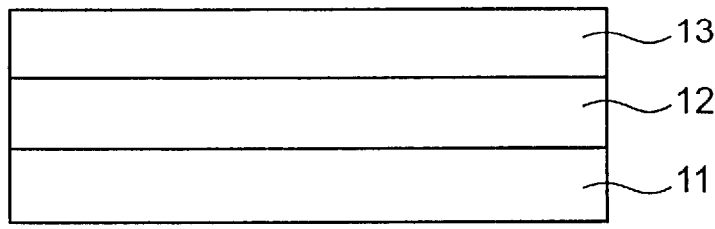
FIGS. 4A to 4E are process views of a method of manufacturing the vertical MOS transistor of FIG. 1.

(1) Step of FIG. 4A (a First Epitaxial Growth Layer Formation Step and a Second Epitaxial Growth Layer Formation Step)

A p– epitaxial growth layer 12 (for example, B, 3e16 to 5e17/cm$^3$) having a thickness of about 0.5 to 2.5 $\mu$m is formed on a (100) plane of an n+ semiconductor substrate 11 (for example, As or Sb$\geq$1e19/cm$^3$). An n– epitaxial growth layer 13 (for example, B>5e15 to 2e16/cm$^3$) having a thickness of about 1 to 10 $\mu$m is formed on the p– epitaxial growth layer 12.

Figure 4B:
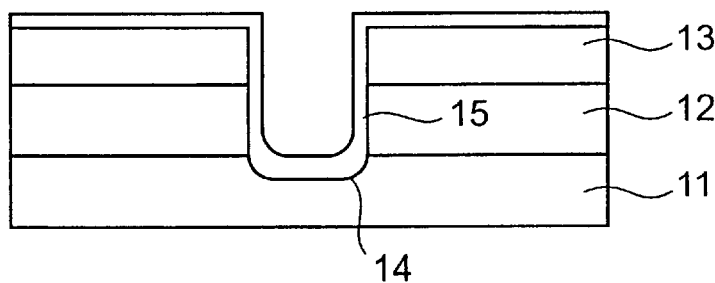

(2) Step of FIG. 4B (a Trench Formation Step and a Gate Oxide Film Formation Step)

A trench 14 is formed by a photolithography technique and by performing an anisotropic dry etching from a trench formation scheduled region on the n– epitaxial growth layer 13 through the n– epitaxial growth layer 13 and the p– epitaxial growth layer 12 to the inside of the semiconductor substrate 11. A gate oxide film 15 (for example, SiO$_2$) having a thickness of 100 to 500 angstroms is formed along the surface of the n– epitaxial growth layer 13 and the wall surface of the trench 14. In the gate oxide film 15, the portion formed along the bottom of the trench 14 is formed to be thicker, by the enhanced oxidation on the n+ semiconductor substrate 11, than the portion formed along the side wall.

Figure 4C:
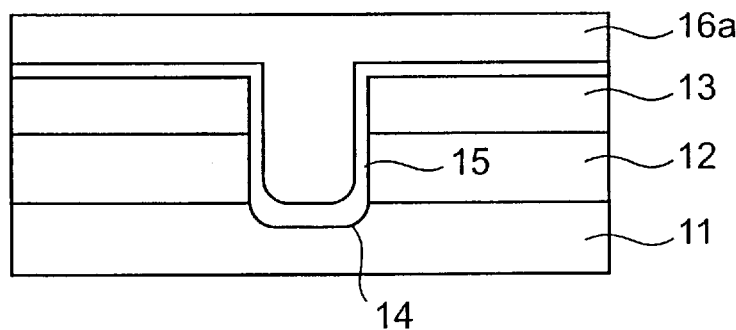

(3) Polycrystalline Silicon Layer Deposit Step of FIG. 4C

A polycrystalline silicon layer 16A is deposited on the gate oxide film 15.

Figure 4D:
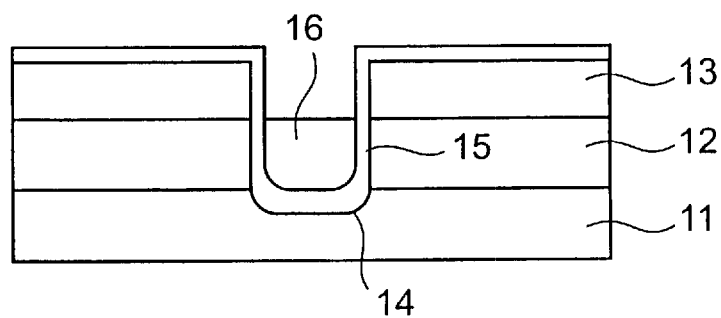

(4) Gate Formation Step of FIG. 4D

The polycrystalline silicon layer 16A is etched until its upper portion reaches an upper portion of the p– epitaxial growth layer, so that a gate 16 is formed in the trench 14.

Figure 4E:
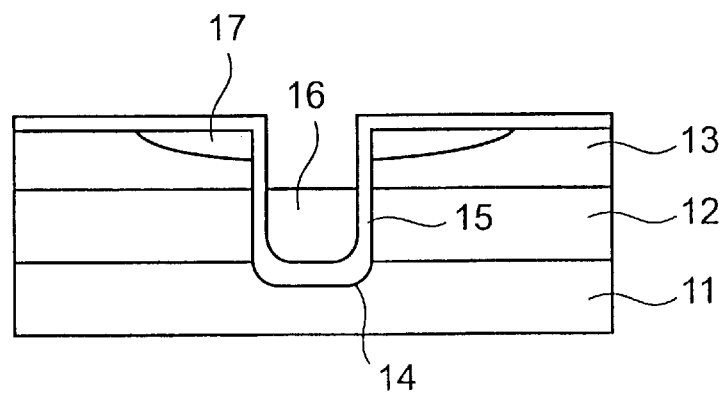

(5) Drain Layer Formation Step of FIG. 4E

An n+ drain layer (for example, As>1e20/cm$^3$) 17 is formed on the surface of the n– epitaxial growth layer 13 and at the periphery of the trench 14.

As described above, according to this first embodiment, since the overlapping area between the gate 16 and the drain layer 17 through the gate oxide film 15 is made smaller than the prior art, the capacitance formed between the gate 16 and the drain layer 17 becomes smaller than the prior art. Thus, in the case where this vertical MOS transistor is used as, for example, a source grounded circuit, the feedback capacitance becomes smaller than the prior art, and the high frequency characteristic of voltage amplification can be improved. Further, since the portion of the gate oxide film 15 formed along the bottom of the trench 14 is formed to be thicker than the portion formed along the side wall, the distance between the gate 16 and the n+ semiconductor substrate 11 becomes larger than the prior art, and the capacitance formed between the gate 16 and the n+ semiconductor substrate 11 is smaller than the prior art. Thus the high frequency characteristic of voltage amplification is improved as compared with the prior art.

Second Embodiment

Figure 5:
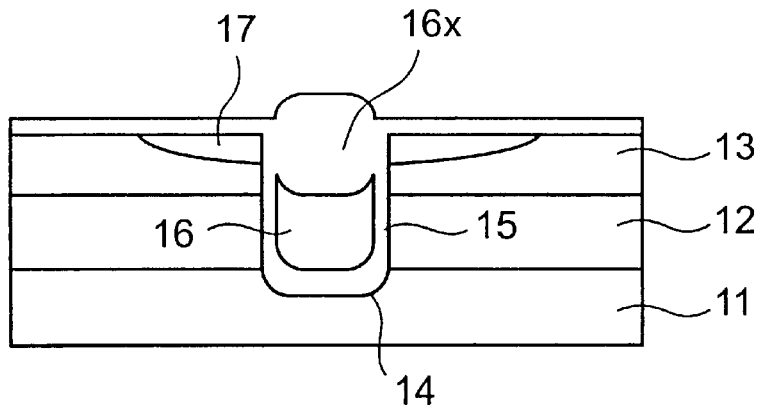
FIG. 5 is a sectional view of a vertical MOS transistor of a second embodiment of the present invention.

FIG. 5 is schematic sectional view of a vertical MOS transistor of a second embodiment of the present invention, and common elements to the elements in FIG. 1 showing the first embodiment are designated by the same reference characters.

In this vertical MOS transistor, an upper portion 16x of a gate 16 is oxidized by an arbitrary amount. The other structure is the same as that of FIG. 1. Also in this vertical MOS transistor, similarly to FIG. 1, an overlapping area between the gate 16 and the n+ drain layer 17 through the gate oxide film 15 becomes smaller than the prior art, and the capacitance formed between the gate 16 and the n+ drain layer 17 is smaller than the prior art.

Figure 6A:
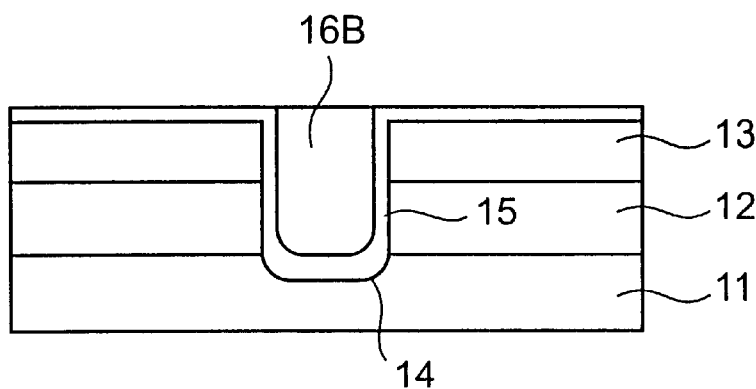
FIGS. 6A to 6C are process views of a method of manufacturing the vertical MOS transistor of FIG. 5.
Figure 6B:
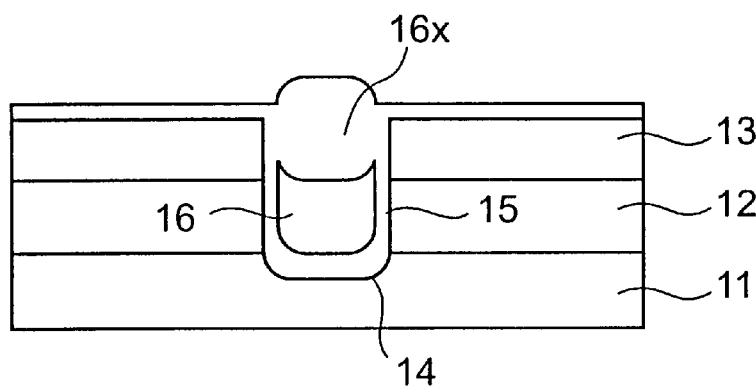
Figure 6C:
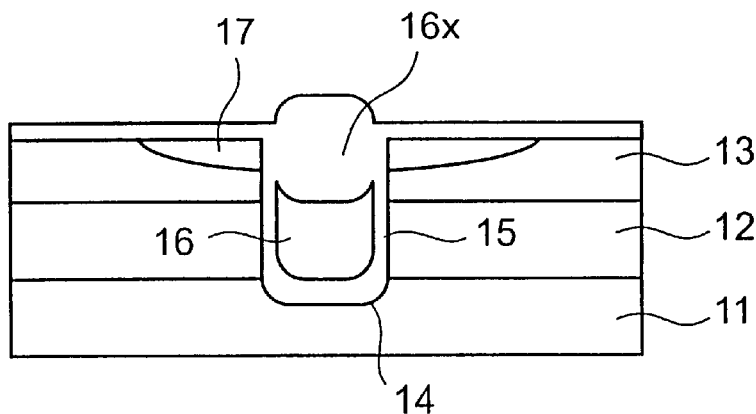

FIGS. 6A to 6C are process views for explaining a method of manufacturing the vertical MOS transistor of FIG. 5.

With reference to the drawings, manufacturing processes (1) to (4) of the vertical MOS transistor of FIG. 5 will be described.
(1) Similarly to FIGS. 4A to 4C showing the first embodiment, a first epitaxial growth layer formation step, a second epitaxial growth layer formation step, a trench formation step, a gate oxide film formation step, and a polycrystalline silicon layer deposit step are carried out.
(2) Gate Formation Step of FIG. 6A
The polycrystalline silicon layer 16A is etched so that the gate 16B is formed in the trench 14.
(3) Gate Oxidation Step of FIG. 6B
The upper portion 16x of the gate 16B is oxidized so that the upper portion of the gate 16 is made coincident with the upper portion of the p– epitaxial growth layer.
(4) Drain Layer Formation Step of FIG. 6C
Similarly to FIG. 4E, the n+ drain layer 17 is formed.

As described above, in this second embodiment, since an overlapping area between the gate 16 and the n+ drain layer 17 through the gate oxide film 15 becomes smaller than the prior art, the same merits as the first embodiment are obtained.

Third Embodiment

Figure 7:
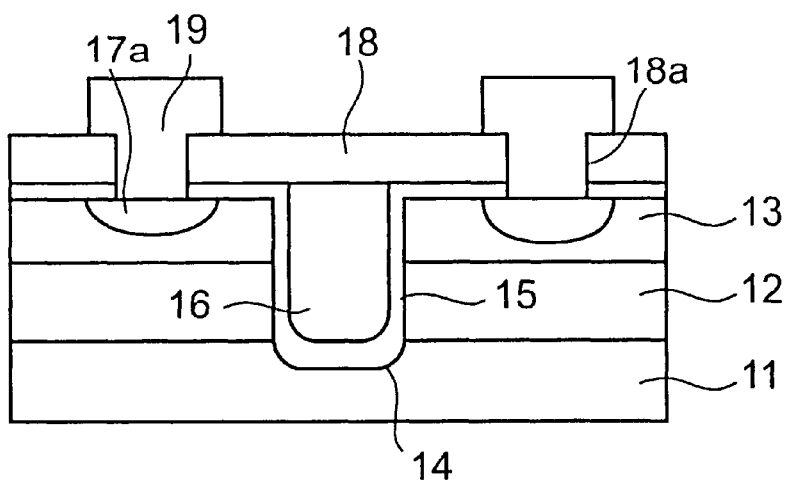
FIG. 7 is a sectional view of a vertical MOS transistor of a third embodiment of the present invention.

FIG. 7 is a sectional view of a vertical MOS transistor of a third embodiment of the present invention, and elements common to the elements in FIG. 1 showing the first embodiment are designated by the same reference characters.

In this vertical MOS transistor, instead of the n+ drain layer 17, an n+ drain layer 17A is formed in a region a desired distance away from a gate 16. Further, an intermediate insulating film 18 is deposited on a gate oxide film 15 and the gate 16. A contact hole 18a is provided in the intermediate insulating film 18, and a drain electrode 19 being in contact with the n+ drain layer 17A through the contact hole 18a is formed. The other structure is similar to that of FIG. 1. In this vertical MOS transistor, since the gate 16 is distant from the n+ drain layer 17A, the capacitance formed between the gate 16 and the n+ drain layer 17A is smaller than the prior art.

Figure 8A:
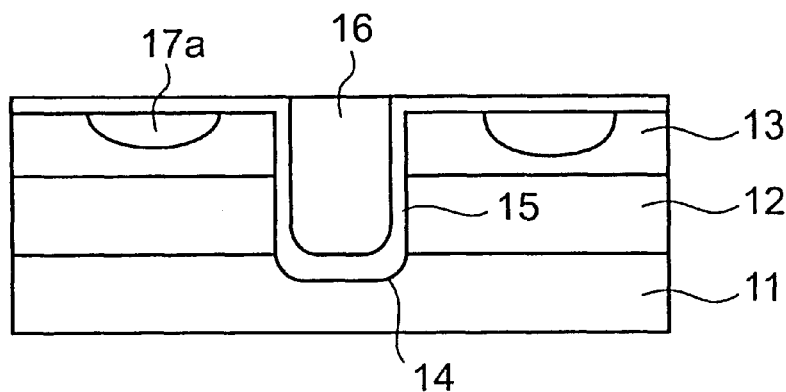
FIGS. 8A and 8B are process views of a method of manufacturing the vertical MOS transistor of FIG. 7.
Figure 8B:
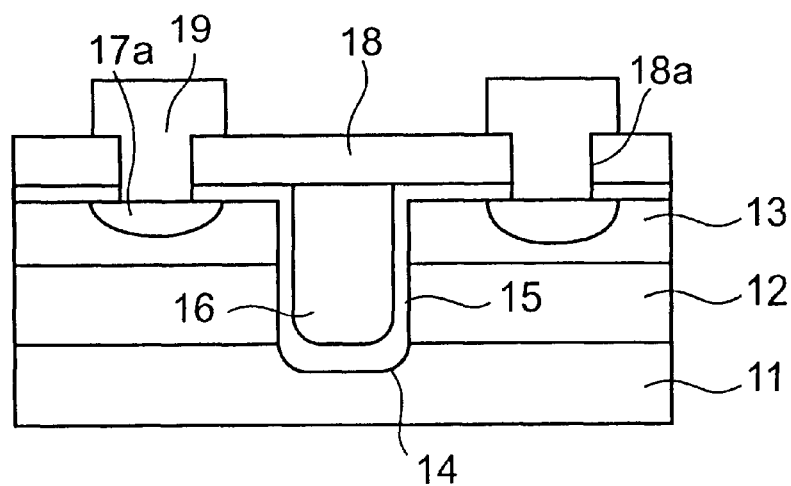

FIGS. 8A and 8B are process views for explaining a method of manufacturing the vertical MOS transistor of FIG. 7.

With reference to the drawings, manufacturing processes (1) to (3) of the vertical MOS transistor of FIG. 7 will be described.
(1) Similarly to FIGS. 4A to 4C showing the first embodiment, a first epitaxial growth layer formation step, a second epitaxial growth layer formation step, a trench formation step, a gate oxide film formation step, and a polycrystalline silicon layer deposit step are carried out. Next, similarly to FIG. 6A showing the second embodiment, a gate formation step is carried out.
(2) Drain Layer Formation Step of FIG. 8A
The n+ drain layer 17A is formed on the surface of the n– epitaxial growth layer 13 and in the region a desired distance away from the gate 16.
(3) Step of FIG. 8B (an Intermediate Insulating Film Deposit Step, a Contact Hole Formation Step, and a Drain Electrode Formation Step)
The intermediate insulating film 18 is deposited on the gate oxide film 15, and the contact hole 18a is formed in an electrode formation scheduled region of the intermediate insulating film 18 and the gate oxide film 15 on the n+ drain layer 17A. The drain electrode 19 being in contact with the n+ drain layer 17A through the contact hole 18a is formed.

As described above, in this third embodiment, since the n+ drain layer 17A is formed in the region spaced apart from the gate 16, the capacitance formed between the gate 16 and the n+ drain layer 17A becomes smaller than the prior art, and the same merits as the first embodiment are obtained.

Fourth Embodiment

Figure 9:
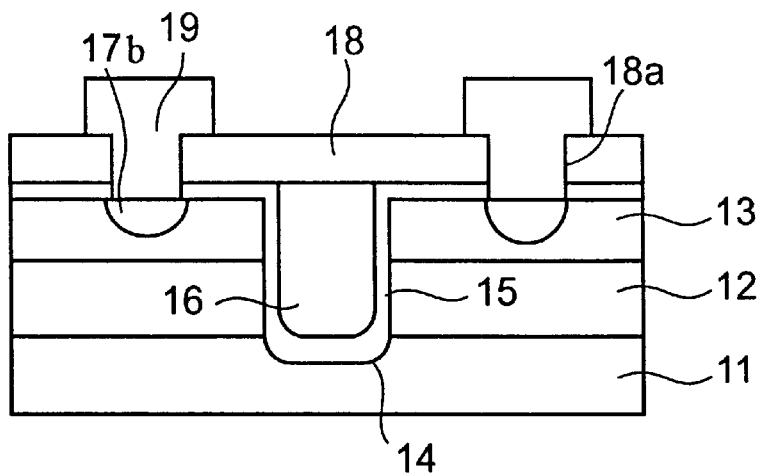
FIG. 9 is a sectional view of a vertical MOS transistor of a fourth embodiment of the present invention.

FIG. 9 is a sectional view of a vertical MOS transistor of a fourth embodiment of the present invention, and elements common to the elements in FIG. 1 showing the first embodiment and elements in FIG. 7 showing the third embodiment are designated by the common characters.

In this vertical MOS transistor, instead of the n+ drain layer 17A in FIG. 7, an n+ drain layer 17B is formed in a region a desired distance away from a gate 16. The shape of the surface of the n+ drain layer 17B is similar to a contact hole 18a. The other structure is the same as that of FIG. 1 and FIG. 7. In this vertical MOS transistor, since the gate 16 is distant from the n+ drain layer 17B, the capacitance formed between the gate 16 and the n+ drain layer 17B is smaller than the prior art.

Figure 10A:
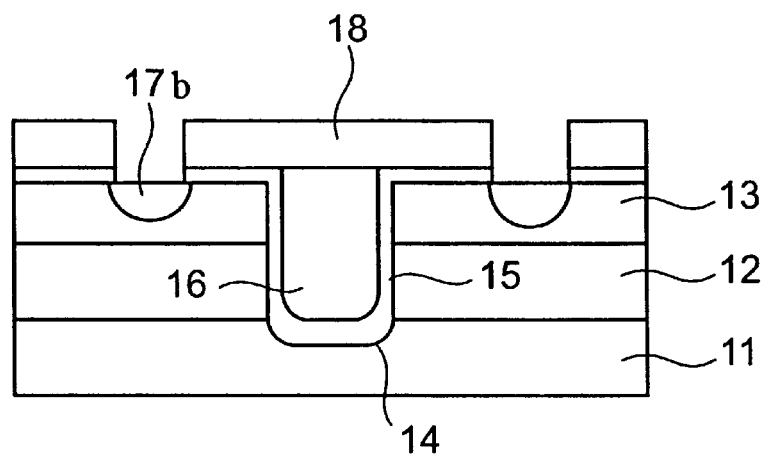
FIGS. 10A and 10B are process views of a method of manufacturing the vertical MOS transistor of FIG. 9.
Figure 10B:
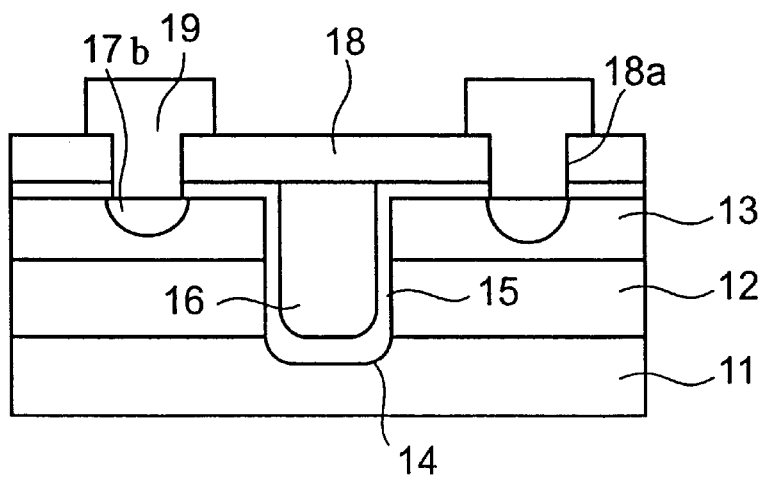

FIGS. 10A and 10B are process views for explaining a method of manufacturing the vertical MOS transistor of FIG. 9.

With reference to the drawings, manufacturing processes (1) to (4) of the vertical MOS transistor of FIG. 9 will be described.
(1) Similarly to FIGS. 4A to 4C showing the first embodiment, a first epitaxial growth layer formation step, a second epitaxial growth layer formation step, a trench formation step, a gate oxide film formation step, and a polycrystalline silicon layer deposit step are carried out. Next, similarly to FIG. 6A showing the second embodiment, a gate formation step is carried out.

(2) Step of FIG. 10A (an Intermediate Insulating Film Deposit Step, a Contact Hole Formation Step, and a Drain Layer Formation Step)

The intermediate insulating film 18 is deposited on the gate oxide film 15, and the contact hole 18a is formed in an electrode formation scheduled region of the intermediate insulating film 18 and the gate oxide film 15. The n+ drain layer 17B is formed on the surface of the n– epitaxial growth layer 13 by using the intermediate insulating film 18 having the contact hole 18a formed therein as a mask.

(3) Step of FIG. 10B (a Drain Electrode Formation Step)

The drain electrode 19 being in contact with the n+ drain layer 17B through the contact hole 18a is formed.

As described above, in this fourth embodiment, since the n+ drain layer 17B is formed in the region distant from the gate 16, the capacitance formed between the gate 16 and the n+ drain layer 17B becomes smaller than the prior art, and the same merits as the first embodiment are obtained.

Fifth Embodiment

Figure 11:
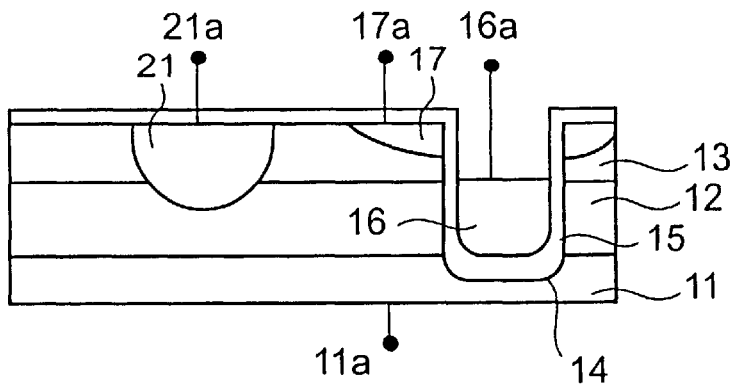
FIG. 11 is a sectional view of a vertical MOS transistor of a fifth embodiment of the present invention.

FIG. 11 is a sectional view of a vertical MOS transistor of a fifth embodiment of the present invention, and elements common to the elements in FIG. 1 showing the first embodiment are designated by the common characters.

In this vertical MOS transistor, a body region 21 of a second conductivity type (for example, p+ body region) is formed so as to reach the inside of the p– epitaxial growth layer 12 through a region depart from the n+ drain layer 17 of the n– epitaxial growth layer 13. A body electrode 21a is connected to the p+ body region 21. The other structure is the same as that of FIG. 1.

In this vertical MOS transistor, the body electrode 21a is connected to the source electrode 11a and the same operation as the first embodiment is performed.

Figure 12A:
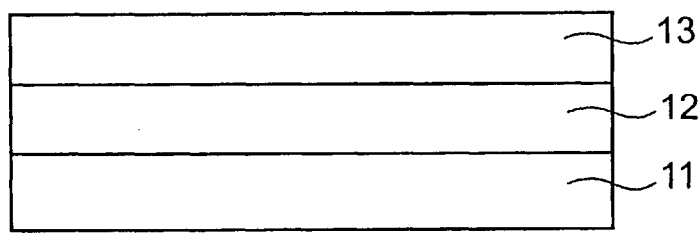
FIGS. 12A to 12C are process views of a method of manufacturing the vertical MOS transistor of FIG. 11.
Figure 12B:
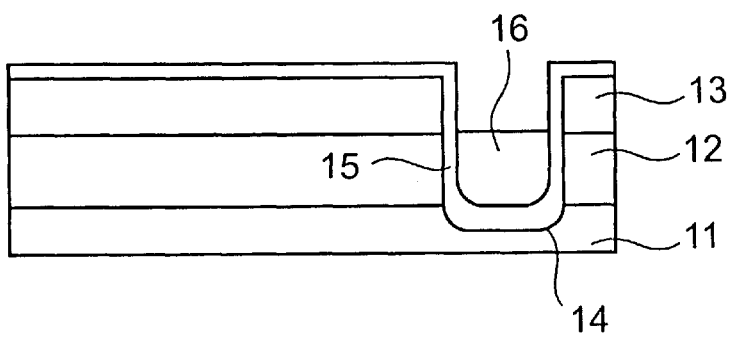
Figure 12C:
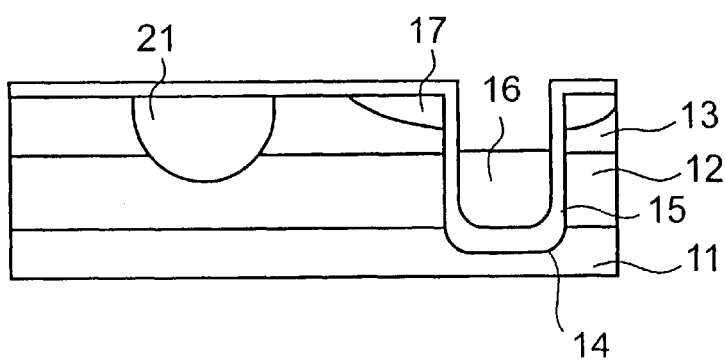

FIGS. 12A to 12C are process views for explaining a method of manufacturing the vertical MOS transistor of FIG. 11.

With reference to the drawings, manufacturing processes (1) to (3) of the vertical MOS transistor of FIG. 11 will be described.

(1) Step of FIG. 12A

Similarly to FIG. 4A showing the first embodiment, a first epitaxial growth layer formation step, and a second epitaxial growth layer formation step are carried out.

(2) Step of FIG. 12B

Similarly to FIGS. 4B to 4D, a trench formation step, a gate oxide film formation step, a polycrystalline silicon layer deposit step, and a gate formation step are carried out.

(3) Step of FIG. 12C (a Drain Layer Formation Step and a Body Region Formation Step)

The p+ body region 21 (for example, boron B, 5e18 to 5e19/cm$^3$) is formed so as to reach the inside of the p– epitaxial growth layer 12 through the n– epitaxial growth layer 13. Thereafter, similarly to FIG. 4E, a drain layer formation step is carried out.

As described above, in this fifth embodiment, the p+ body region 21 is formed in the region distant from the n+ drain layer 17 of the n– epitaxial growth layer 13, and the same merits as the first embodiment are obtained.

Sixth Embodiment

Figure 13:
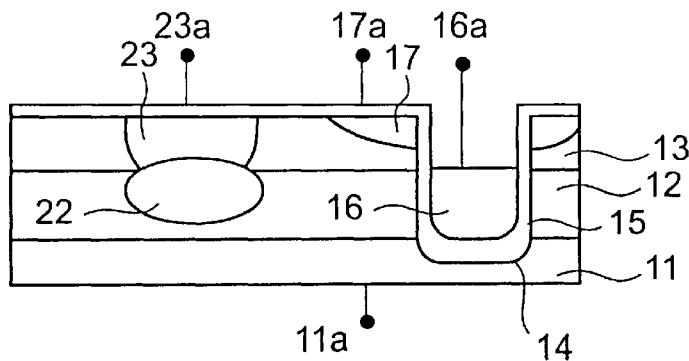
FIG. 13 is a sectional view of a vertical MOS transistor of a sixth embodiment of the present invention.

FIG. 13 is a schematic sectional view of a vertical MOS transistor of a sixth embodiment of the present invention,
and elements common to the elements in FIG. 11 showing the fifth embodiment are designated by the common characters.

In this vertical MOS transistor, a first body region 22 of a second conductivity type (for example, p+ body region) is formed at a contact portion between the p– epitaxial growth layer 12 and the n– epitaxial growth layer 13. Further, in the inside of the n– epitaxial growth layer 13, a second body region (for example, p+ body region) 23 is formed to come in contact with the p+ body region 22. A body electrode 23a is connected to the p+ body region 23. The other structure is the same as that of FIG. 11.

In this vertical MOS transistor, the body electrode 23a is connected to the source electrode 11a and the same operation as the first embodiment is carried out.

FIGS. 14A to 14D are process views for explaining a method of manufacturing the vertical MOS transistor of FIG. 13.

With reference to the drawings, manufacturing processes (1) to (4) of the vertical MOS transistor of FIG. 13 will be described.

Figure 14A:
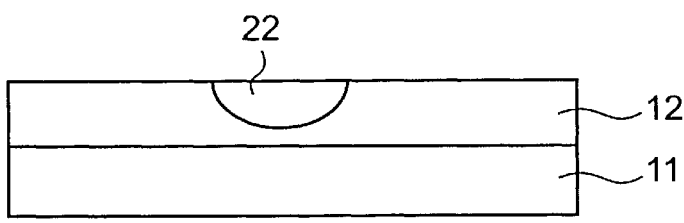
FIGS. 14A to 14D are process views of a method of manufacturing the vertical MOS transistor of FIG. 13.

(1) Step of FIG. 14A (a First Epitaxial Growth Layer Formation Step and a First Body Region Formation Step)

The p– epitaxial growth layer 12 is formed on the n+ semiconductor substrate 11, and the p+ body region 22 (for example, boron B, 5e18 to 5e19/cm$^3$) is formed in a desired region of the surface of the p– epitaxial growth layer 12.

Figure 14B:
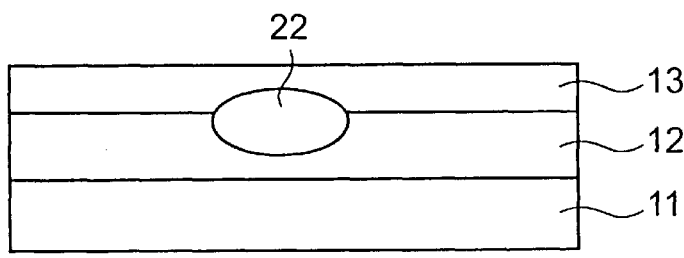

(2) Step of FIG. 14B (a Second Epitaxial Growth Layer Formation Step)

The n– epitaxial growth layer 13 is formed on the p– epitaxial growth layer 12.

Figure 14C:
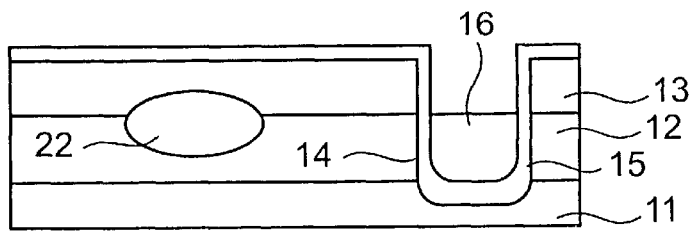

(3) Step of FIG. 14C (a Trench Formation Step, a Gate Oxide Film Formation Step, a Polycrystalline Silicon Layer Deposit Step, and a Gate Formation Step)

Similarly to FIGS. 4B to 4D, a trench formation step, a gate oxide film formation step, a polycrystalline silicon layer deposit step, and a gate formation step are carried out.

Figure 14D:
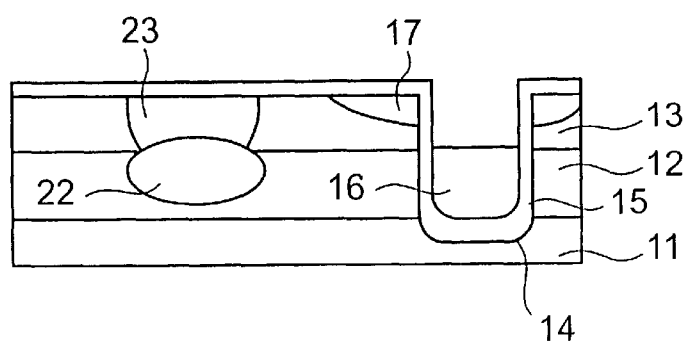

(4) Step of FIG. 14D (a Drain Layer Formation Step and a Second Body Region Formation Step)

The p+ body region 23 (for example, boron B, 5e18 to 1e20/cm$^3$) is formed in a region an arbitrary distance away from the n+ drain layer 17 of the inside of the n– epitaxial growth layer 13 so as to come in contact with the p+ body region 22. Thereafter, similarly to FIG. 4E, a drain layer formation step is carried out.

As described above, in this sixth embodiment, the p+ body region 23 is formed in the region distant from the n+ drain layer 17 of the n– epitaxial growth layer 13, and the same merits as the first embodiment are obtained.

Seventh Embodiment

Figure 15:
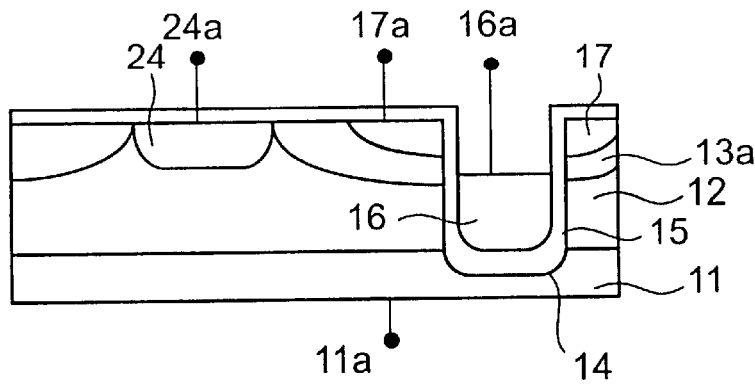
FIG. 15 is a sectional view of a vertical MOS transistor of a seventh embodiment of the present invention.

FIG. 15 is a schematic sectional view of a vertical MOS transistor of a seventh embodiment of the present invention, and common elements to the elements in FIG. 11 showing the fifth embodiment are designated by the common characters.

In this vertical MOS transistor, a p– epitaxial growth layer 12 is formed on an n+ semiconductor substrate 11. A trench 14 is formed so as to reach the inside of the n+ semiconductor substrate 11 through the p– epitaxial growth layer 12. A gate oxide film 15 is formed along the surface of the epitaxial growth layer 12 and the wall surface of the trench 14. A gate 16 is filled in the trench 14 so as to be surrounded by the gate oxide film 15. A diffusion layer 13A of a first conductivity type (for example, n– diffusion layer) is formed on the surface of the p– epitaxial growth layer 12 and at a desired region of the periphery of the trench 14. An n+ drain layer 17 is formed on the surface of the diffusion layer 13A and at the periphery of the trench 14. A body region 24 of a second conductivity type (for example, p+ body region) is formed in a desired region of the surface of the p– epitaxial growth layer 12. A body electrode 24a is connected to the p+ body region 24.

In this vertical MOS transistor, the body electrode 24a is connected to the source electrode 11a and the same operation as the first embodiment is carried out.

Figure 16A:
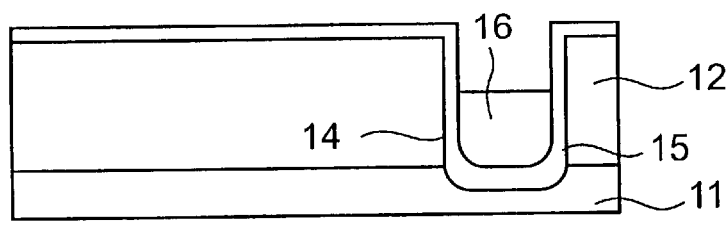
FIGS. 16A to 16C are process views of a method of manufacturing the vertical MOS transistor of FIG. 15.
Figure 16B:
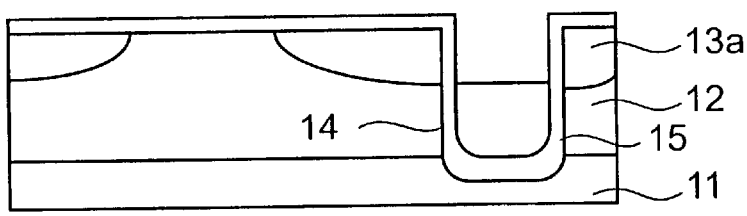
Figure 16C:
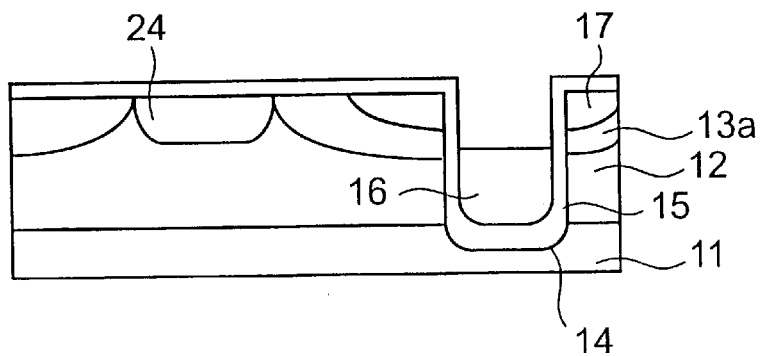

FIGS. 16A to 16C are process views for explaining a method of manufacturing the vertical MOS transistor of FIG. 15.

With reference to the drawings, manufacturing processes (1) to (3) of the vertical MOS transistor of FIG. 15 will be described.

(1) Step of FIG. 16A (an Epitaxial Growth Layer Formation Step, a Trench Formation Step, a Gate Oxide Film Formation Step, a Polycrystalline Silicon Layer Deposit Step, and a Gate Formation Step)

The p– epitaxial growth layer 12 is formed on the n+ semiconductor substrate 11. The trench 14 is formed by the photolithography technique and by performing the anisotropic dry etching from a trench formation scheduled region on the p– epitaxial growth layer 12 through the p– epitaxial growth layer 12 to the inside of the n+ semiconductor substrate 11. The gate oxide film 15 is formed along the surface of the p– epitaxial growth layer 12 and the wall surface of the trench 14. A polycrystalline silicon layer is deposited on the gate oxide film 15. An arbitrary amount of etching is performed to the polycrystalline silicon layer, so that the gate 16 is formed in the trench 14.

(2) Step of FIG. 16B (a Diffusion Layer Formation Step)

The n– diffusion layer 13A is formed in the desired region on the surface of the p– epitaxial growth layer 12 and at the periphery of the trench 14.

(3) Step of FIG. 16C (a Drain Layer Formation Step and a Body Region Formation Step)

The n+ drain layer 17 is formed on the surface of the n– diffusion layer 13A and at the periphery of the trench 14. The p+ body region 24 is formed in the desired region of the surface of the p– epitaxial growth layer 12.

As described above, in this seventh embodiment, the p+ body region 24 is formed in the region distant from the n+ drain layer 17 of the p– epitaxial growth layer 12, and the same merits as the first embodiment are obtained.

Eighth Embodiment

Figure 17:
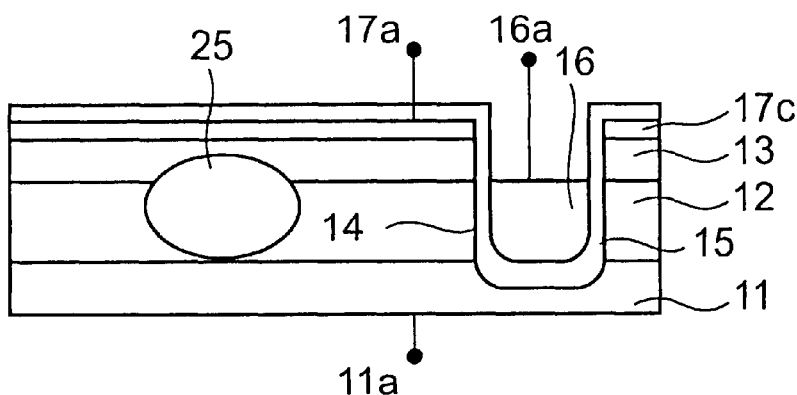
FIG. 17 is a sectional view of a vertical MOS transistor of an eighth embodiment of the present invention.

FIG. 17 is a schematic sectional view of a vertical MOS transistor of an eighth embodiment of the present invention, and common elements to the elements in FIG. 1 showing the first embodiment are designated by the common characters.

In this vertical MOS transistor, a body region 25 of a second conductivity type (for example, p+ body region) is formed at a contact portion between an n+ semiconductor substrate 11 and a p– epitaxial growth layer 12. Further, instead of the n+ drain layer 17 in FIG. 1, an n+ drain layer 17C is formed on an n– epitaxial growth layer 13. The other structure is the same as that of FIG. 1.

In this vertical MOS transistor, the p+ body region 25 of a high concentration is connected to the n+ semiconductor substrate 11 through the ohmic contact, and the same operation as the first embodiment is carried out.

Figure 18A:
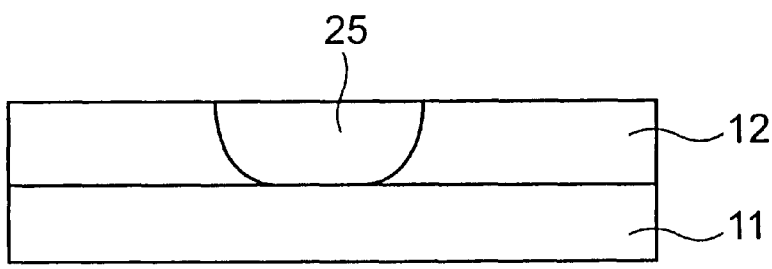
FIGS. 18A to 18C are process views of a method of manufacturing the vertical MOS transistor of FIG. 17.
Figure 18B:
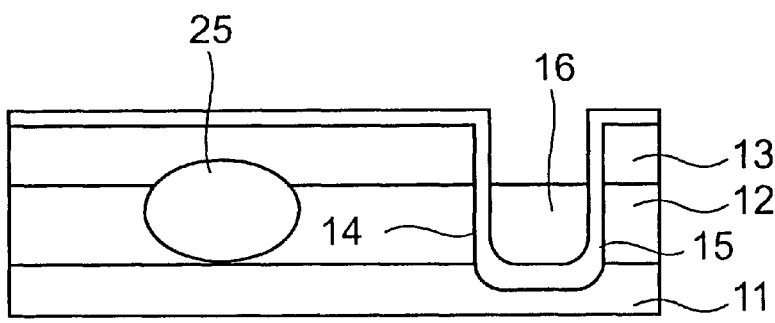
Figure 18C:
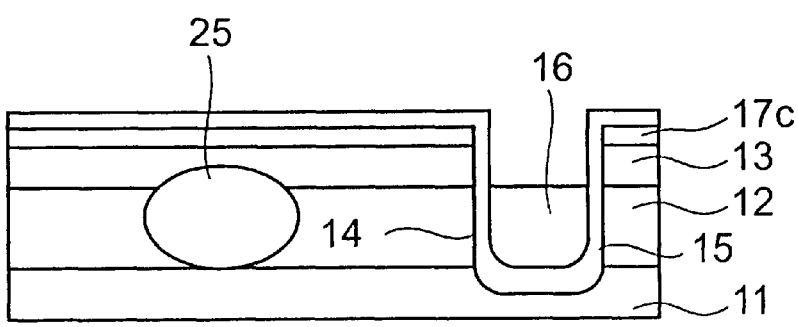

FIGS. 18A to 18C are process views for explaining a method of manufacturing the vertical MOS transistor of FIG. 17.

With reference to the drawings, manufacturing processes (1) to (3) of the vertical MOS transistor of FIG. 17 will be described.

(1) Step of FIG. 18A (a First Epitaxial Growth Layer Formation Step and a Body Region Formation Step)

The p– epitaxial growth layer 12 is formed on the n+ semiconductor substrate 11.

The p+ body region 25 is formed in the p– epitaxial growth layer 12 so as to come in contact with the n+ semiconductor substrate 11.

(2) Step of FIG. 18B (a Second Epitaxial Growth Layer Formation Step, a Trench Formation Step, a Gate Oxide Film Formation Step, a Polycrystalline Silicon Layer Deposit Step, and a Gate Formation Step)

The n– epitaxial growth layer 13 is formed on the p– epitaxial growth layer 12. The trench 14 is formed by the photolithography technique and by performing the anisotropic dry etching from a trench formation scheduled region on the n– epitaxial growth layer 13 through the n– epitaxial growth layer 13 and the p– epitaxial growth layer 12 to the inside of the n+ semiconductor substrate 11. The gate oxide film 15 is formed along the surface of the n– epitaxial growth layer 13 and the wall surface of the trench 14. A polycrystalline silicon layer is deposited on the gate oxide film 15. An arbitrary amount of etching is performed to the polycrystalline silicon layer, so that the gate 16 is formed in the trench 14.

(3) Step of FIG. 18C (a Drain Layer Formation Step)

The n+ drain layer 17C is formed on the surface of the n– epitaxial growth layer 13 and at the periphery of the trench 14.

Figure 19A:
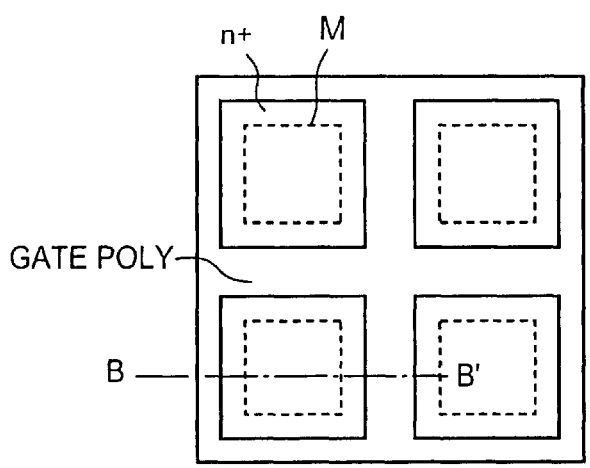
FIGS. 19A and 19B are structural views of a case where a metal contact pattern M is provided in the vertical MOS transistor of FIG. 17.
Figure 19B:
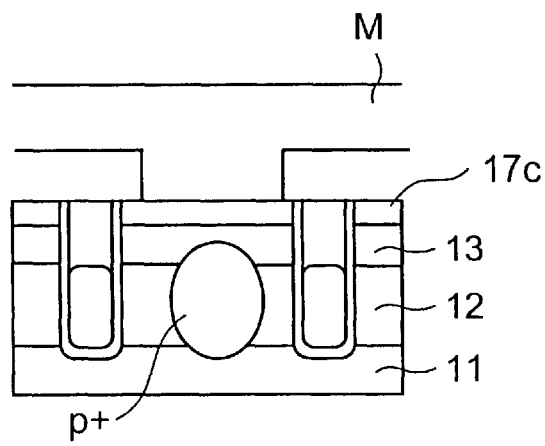

FIGS. 19A and 19B are structural views of a case where a metal contact pattern M is provided in the vertical MOS transistor of FIG. 17. FIG. 19A is a plan view, and FIG. 19B is a sectional view taken along line B–B' of FIG. 19A.

Figure 3A:
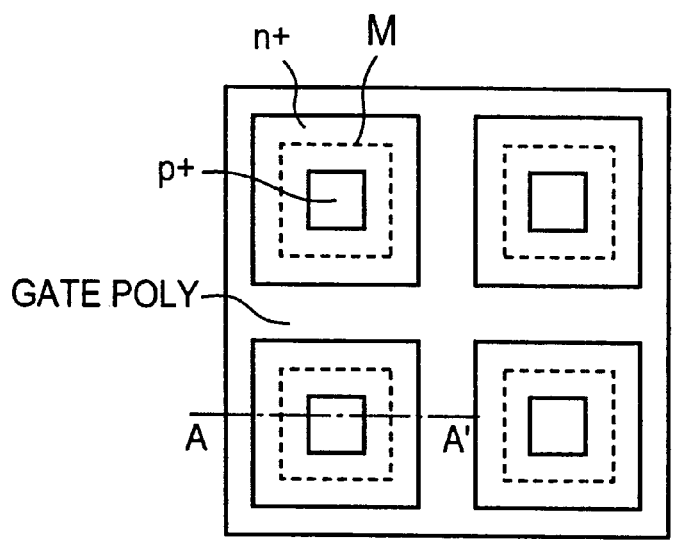
FIGS. 3A and 3B are structural views of a case where a metal contact pattern M is provided in the vertical MOS transistor of FIG. 2.
Figure 3B:
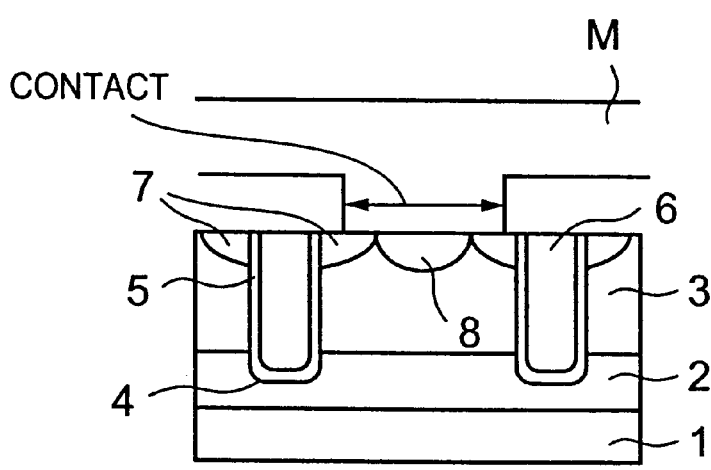

As shown in FIG. 19B, in the case where the contact pattern M as a drain electrode is connected to the n+ drain layer 17C, the contact pattern M can be formed with the minimum size based on a design rule. Thus, as shown in FIG. 19A, a lattice pattern becomes smaller than the conventional vertical MOS transistor shown in FIG. 3, and miniaturization is easy. Thus, lattice density becomes high and a high current can be made to flow. Alternatively, an area of an element for obtaining a definite current becomes small.

As described above, in this eighth embodiment, the p+ body region 25 is connected to the n+ semiconductor substrate 11 and the same merits as the first embodiment are obtained. Further, since the p+ body region 25 is formed at the contact portion between the n+ semiconductor substrate 11 and the p– epitaxial growth layer 12, the contact pattern M can be formed with the minimum size and miniaturization can be easily made. Thus, the lattice density becomes larger than the conventional vertical MOS transistor, and the current density per unit area of an element becomes large.

Ninth Embodiment

Figure 20:
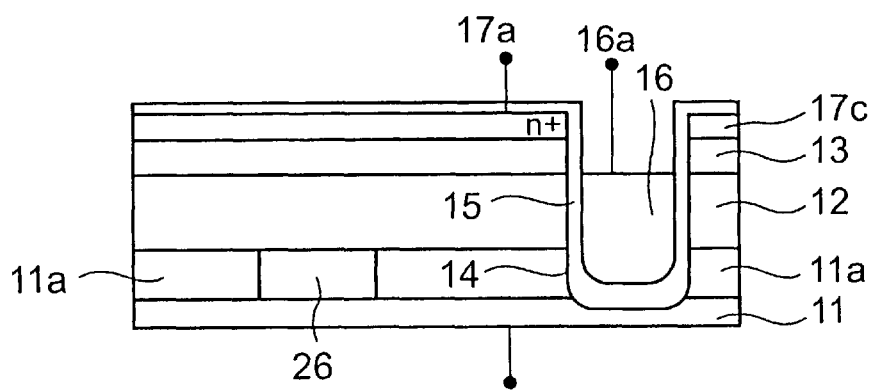
FIG. 20 is a sectional view of a vertical MOS transistor of a ninth embodiment of the present invention.

FIG. 20 is a schematic sectional view of a vertical MOS transistor of a ninth embodiment of the present invention, and common elements to the elements in FIG. 1 showing the first embodiment and to elements in FIG. 17 showing the eighth embodiment are designated by the common characters.

In this vertical MOS transistor, an n+ diffusion region 11A is formed on the n+ semiconductor substrate 11 in FIG. 17, and a body region 26 of a second conductivity type (for example, p+ body region) is formed in a region distant from the gate 16 in the n+ diffusion region 11A. The p+ body region 26 of a high concentration is in ohmic contact with the n+ semiconductor substrate 11. The other structure is the same as that of FIG. 1 and FIG. 17.

FIGS. 21A to 21E are process views for explaining a method of manufacturing the vertical MOS transistor of FIG. 20.

With reference to the drawings, manufacturing processes (1) to (5) of the vertical MOS transistor of FIG. 20 will be described.

Figure 21A:
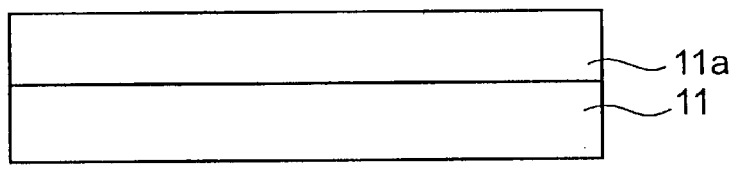
FIGS. 21A to 21E are process views of a method of manufacturing the vertical MOS transistor of FIG. 20.

(1) Step of FIG. 21A (a First Epitaxial Growth Layer Formation Step)

An n− epitaxial growth layer 11A is formed on the n+ semiconductor substrate 11.

Figure 21B:
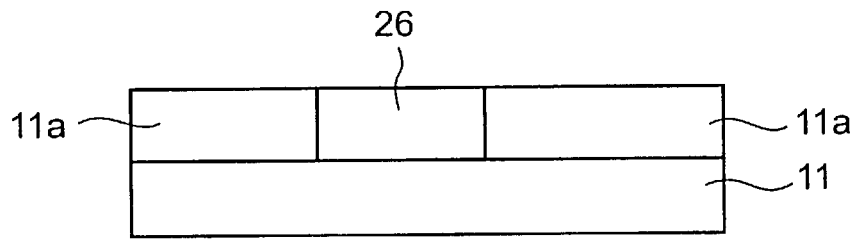

(2) Step of FIG. 21B (a Body Region Formation Step)

A p+ impurity is introduced in a desired region in the n− epitaxial growth layer 11A to form the p+ body region 26 so as to come in contact with the semiconductor substrate 11, and an n+ impurity is introduced in other regions of the n− epitaxial growth layer 11A to form the n+ diffusion region 11A.

Figure 21C:
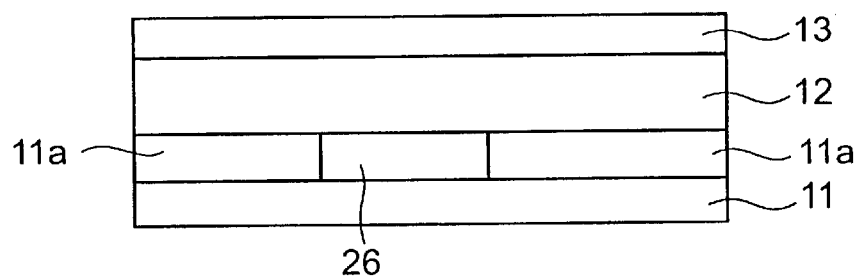

(3) Step of FIG. 21C (a Second Epitaxial Growth Layer Formation Step, a Third Epitaxial Growth Layer Formation Step))

The p− epitaxial growth layer 12 is formed on the n+ epitaxial growth layer 11A and the body region 26. The n− epitaxial growth layer 13 is formed on the p− epitaxial growth layer 12.

Figure 21D:
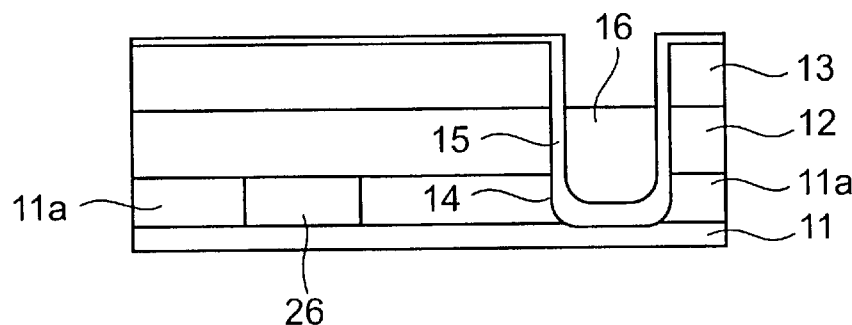

(4) Step of FIG. 21D (a Trench Formation Step, a Gate Oxide Film Formation Step, a Polycrystalline Silicon Layer Deposit Step, and a Gate Formation Step)

The trench 14 is formed by the photolithography technique and by performing the anisotropic dry etching from a trench formation scheduled region on the n− epitaxial growth layer 13 through the n− epitaxial growth layer 13, the p− epitaxial growth layer 12, and the n+ epitaxial growth layer 11A to the inside of the n+ semiconductor substrate 11. The gate oxide film 15 is formed along the surface of the n− epitaxial growth layer 13 and the wall surface of the trench 14. A polycrystalline silicon layer is deposited on the gate oxide film 15. An arbitrary amount of etching is performed to the polycrystalline silicon layer, so that the gate 16 is formed in the trench 14.

Figure 21E:
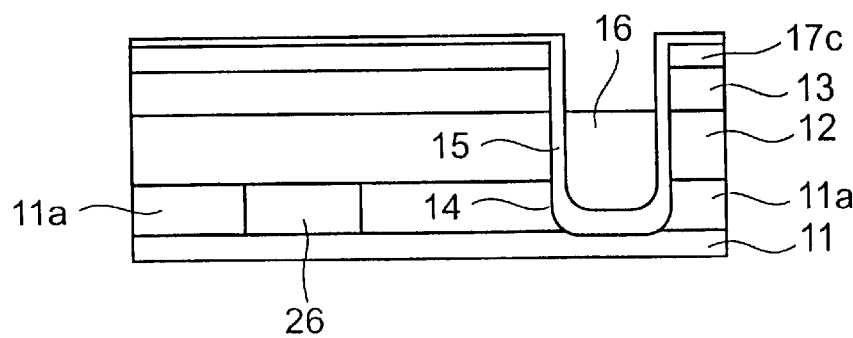

(5) Step of FIG. 21E (a Drain Layer Formation Step)

The n+ drain layer 17C is formed on the surface of the n− epitaxial growth layer 13 and at the periphery of the trench 14.

As described above, in this ninth embodiment, since the p+ body region 26 is formed at the contact portion between the n+ semiconductor substrate 11 and the p− epitaxial growth layer 12, and the p+ body region 26 is connected to the n+ semiconductor substrate 11, the same merits as the eighth embodiment are obtained.

Note that the present invention is not limited to the above embodiments, but various modifications are possible. The modifications are, for example, as follows:

(a) In the respective embodiments, although the n− channel vertical MOS transistor has been described, the functions and effects nearly equal to those of the above embodiments can be obtained even for a p− channel vertical MOS transistor in which n− type regions and p− type regions are reversed.

(b) Although the trench 14 in FIG. 1 is formed into the U shape, even if this is made, for example, a V shape, the functions and effects nearly equal to those of the above embodiments can be obtained. In this case, a V-shaped trench is formed by performing a wet etching.

(c) In the respective embodiments, although the single gate 16 is provided, a plurality of gates may be provided.

(d) In FIGS. 1, 11, 13, 15, 17 and 20, although the upper portion of the gate 16 is removed, even if it is not removed, the functions and effects nearly equal to those of the embodiments can be obtained. Besides, the upper portion of the gate 16 may be oxidized similarly to FIG. 5.

(e) In FIGS. 7 and 9, although the upper portion of the gate 16 is not removed, even if it is removed, similar functions and effects can be obtained. Besides, the upper portion of the gate 16 may be oxidized similarly to FIG. 5.

As described above in detail, according to the present invention, since an overlapping area between a gate and a drain layer through a gate oxide film is made smaller than the prior art, the capacitance formed between the gate and the drain layer becomes smaller than the prior art. Thus, when this vertical MOS transistor is used as, for example, a source grounded circuit, the feedback capacitance becomes smaller than the prior art, and the high frequency characteristic of voltage amplification can be improved. Further, since the portion of the gate oxide film formed along the bottom of the trench is formed to be thicker than the portion formed along the side wall, the distance between the gate and the semiconductor substrate becomes larger than the prior art, and the capacitance formed between the gate and the semiconductor substrate is smaller than the prior art. Thus, the high frequency characteristic of the voltage amplification can be improved as compared with the prior art.

Further, since the body region is formed at the contact portion between the semiconductor substrate and the first epitaxial growth layer, in the case where the contact pattern as the drain electrode is connected to the drain layer, the contact pattern can be formed with the minimum size based on the design rule. Thus, the lattice pattern becomes smaller than the conventional vertical MOS transistor, and an element can be easily miniaturized. Accordingly, the lattice density becomes higher than the conventional vertical MOS transistor, and a high current can be made to flow. Alternatively, an area of an element for obtaining a definite current can be made small.

What is claimed is:

1. A method of manufacturing a vertical MOS transistor, comprising:

a first epitaxial growth layer formation step of forming a first epitaxial growth layer of a second conductivity type on a semiconductor substrate of a first conductivity type;

a second epitaxial growth layer formation step of forming a second epitaxial growth layer of the first conductivity type on the first epitaxial growth layer;

a trench formation step of forming a trench by performing anisotropic etching through the second epitaxial growth layer and the first epitaxial growth layer to reach within the semiconductor substrate;

a gate oxide film formation step of forming a gate oxide film along a surface of the second epitaxial growth layer and a side wall and bottom surface of the trench;

a polycrystalline silicon layer deposit step of depositing a polycrystalline silicon layer on the gate oxide film;

a gate formation step of forming a gate in the trench by etching the polycrystalline silicon layer so that an upper surface of the gate is coincident with an upper surface of the first epitaxial growth layer; and a drain layer formation step of forming a drain layer of the first conductivity type in an upper surface of the second epitaxial growth layer and at a periphery of the trench.

2. A method of manufacturing a vertical MOS transistor, comprising:

a first epitaxial growth layer formation step of forming a first epitaxial growth layer of a second conductivity type on a semiconductor substrate of a first conductivity type;

a second epitaxial growth layer formation step of forming a second epitaxial growth layer of the first conductivity type on the first epitaxial growth layer;

a trench formation step of forming a trench by performing anisotropic etching through the second epitaxial growth layer and the first epitaxial growth layer to reach within the semiconductor substrate;

a gate oxide film formation step of forming a gate oxide film along a surface of the second epitaxial growth layer and a side wall and bottom surface of the trench;

a polycrystalline silicon layer deposit step of depositing a polycrystalline silicon layer on the gate oxide film;

a gate formation step of forming a gate in the trench by etching the polycrystalline silicon film;

a gate oxidation step of oxidizing the gate so that an upper surface of the polycrystalline silicon layer is coincident with an upper surface of the first epitaxial growth layer and oxidized polycrystalline silicon is above the upper surface of the polycrystalline silicon layer; and a drain layer formation step of forming a drain layer of the first conductivity type in an upper surface of the second epitaxial growth layer and at a periphery of the trench.

3. A method of manufacturing a vertical MOS transistor according to claim 1; further comprising a body region formation step of forming a body region of the second conductivity type in the second epitaxial growth layer so as to reach an inside of the first epitaxial growth layer.

4. A method of manufacturing a vertical MOS transistor according to claim 1; further comprising a first body region formation step of forming a first body region of the second conductivity type in a desired region of the upper surface of the first epitaxial growth layer prior to the second epitaxial growth layer formation step; and a second body region formation step of forming a second body region in the second epitaxial growth layer at a region an arbitrary distance away from the drain layer so as to come in contact with the first body region.

5. A method of manufacturing a vertical MOS transistor comprising:

an epitaxial growth layer formation step of forming an epitaxial growth layer of a second conductivity type on a semiconductor substrate of a first conductivity type;

a trench formation step of forming a trench by performing anisotropic etching through the epitaxial growth layer to reach within the semiconductor substrate;

a gate oxide film formation step of forming a gate oxide film along a surface of the epitaxial growth layer and a side wall and a bottom surface of the trench;

a polycrystalline silicon layer deposit step of depositing a polycrystalline silicon layer on the gate oxide film;

a gate formation step of forming a gate in the trench by etching the polycrystalline silicon layer so that an upper surface of the gate is below an upper surface of the epitaxial growth layer;

a diffusion layer formation step of forming a diffusion layer of the first conductivity type in the surface of the epitaxial growth layer and at a periphery of the trench so as to have such a depth that a bottom of the diffusion layer reaches the upper surface of the gate;

a drain layer formation step of forming a drain layer of the first conductivity type in the diffusion layer and at the periphery of the trench; and a body region formation step of forming a body region of the second conductivity type in a desired region of the upper surface of the epitaxial growth layer.

6. A method of manufacturing a vertical MOS transistor, comprising:

a first epitaxial growth layer formation step of forming a first epitaxial growth layer of a second conductivity type on a semiconductor substrate of a first conductivity type;

a body region formation step of forming a body region of the second conductivity type in the first epitaxial growth layer so as to come in contact with the semiconductor substrate;

a second epitaxial growth layer formation step of forming a second epitaxial growth layer of the first conductivity type on the first epitaxial growth layer;

a trench formation step of forming a trench by performing anisotropic etching through the second epitaxial growth layer and the first epitaxial growth layer to reach within the semiconductor substrate;

a gate oxide film formation step of forming a gate oxide film along a surface of the second epitaxial growth layer and a side wall and bottom surface of the trench;

a polycrystalline silicon layer deposit step of depositing a polycrystalline silicon layer on the gate oxide film;

a gate formation step of forming a gate in the trench by etching the polycrystalline silicon layer so that an upper surface of the gate is coincident with an upper surface of the first epitaxial growth layer; and a drain layer formation step of forming a drain layer of the first conductivity type in an upper surface of the second epitaxial growth layer and at a periphery of the trench.

7. A method of manufacturing a vertical MOS transistor, comprising:

a first epitaxial growth layer formation step of forming a first epitaxial growth layer of a first conductivity type on a semiconductor substrate of a first conductivity type;

a body region formation step of forming a body region of a second conductivity type in a desired region of the first epitaxial growth layer so as to come in contact with the semiconductor substrate;

a high concentration diffusion region formation step of forming a high concentration diffusion region of the first conductivity type in a region of the first epitaxial growth layer other than the body region;

a second epitaxial growth layer formation step of forming a second epitaxial growth layer of the second conductivity type on the first epitaxial growth layer;

third epitaxial growth layer formation step of forming a third epitaxial growth layer of the first conductivity type on the second epitaxial growth layer;

a trench formation step of forming a trench by performing anisotropic etching through the third epitaxial growth layer and the second epitaxial growth layer to reach within the first epitaxial growth layer;

a gate oxide film formation step of forming a gate oxide film along a surface of the third epitaxial growth layer and a side wall and a bottom surface of the trench;

a polycrystalline silicon layer deposit step of depositing a polycrystalline silicon layer on the gate oxide film;

a gate formation step of forming a gate in the trench by etching the polycrystalline silicon layer so that an upper portion of the gate is coincident with an upper surface of the second epitaxial growth layer; and a drain layer formation step of forming a drain layer of the first conductivity type in the surface of the third epitaxial growth layer and at a periphery of the trench.

8. A method of manufacturing a vertical MOS transistor according to claim 1; further comprising the step of connecting a source electrode to the semiconductor substrate.

9. A method of manufacturing a vertical MOS transistor according to claim 1; wherein the gate oxide film formation step includes forming the gate oxide film thicker along the bottom surface of the trench than along the side wall thereof.

10. A method of manufacturing a vertical MOS transistor according to claim 2; further comprising the step of connecting a source electrode to the semiconductor substrate.

11. A method of manufacturing a vertical MOS transistor according to claim 2; wherein the gate oxide film formation step includes forming the gate oxide film thicker along the bottom surface of the trench than along the side wall thereof.

12. A method of manufacturing a vertical MOS transistor according to claim 3; further comprising the steps of connecting a source electrode to the semiconductor substrate; and connecting a body electrode to the body region and the source electrode.

13. A method of manufacturing a vertical MOS transistor according to claim 4; further comprising the steps of connecting a source electrode to the semiconductor substrate; and connecting a body electrode to the second body region and the source electrode.

14. A method of manufacturing a vertical MOS transistor according to claim 5; further comprising the steps of connecting a source electrode to the semiconductor substrate; and connecting a body electrode to the body region and the source electrode.

15. A method of manufacturing a vertical MOS transistor according to claim 5; wherein the gate oxide film formation step includes forming the gate oxide thicker along the bottom surface of the trench than along the side wall thereof.

16. A method of manufacturing a vertical MOS transistor according to claim 6; further comprising the steps of connecting a source electrode to the semiconductor substrate; and connecting a body electrode to the body region and the source electrode.

17. A method of fabricating a vertical MOS transistor, comprising the steps of: providing a semiconductor substrate of a first conductivity type; forming an epitaxial layer on the semiconductor substrate; forming a trench by anisotropically etching through the epitaxial layer to reach within the semiconductor substrate; forming a gate oxide film along an upper surface of the epitaxial layer and a side wall and bottom surface of the trench; depositing a polycrystalline silicon layer on the gate oxide film; forming a gate in the trench by etching the polycrystalline silicon layer so that an upper surface thereof is beneath the upper surface of the epitaxial layer; and forming a drain layer of the first conductivity type in an upper surface of the epitaxial layer surrounding the trench.

18. A method of fabricating a vertical MOS transistor according to claim 17; wherein the step of forming the drain layer comprises forming the drain layer spaced apart from the trench.

19. A method of fabricating a vertical MOS transistor according to claim 17; wherein the step of forming the epitaxial layer comprises the steps of forming a first epitaxial layer of a second conductivity type on the semiconductor substrate and forming a second epitaxial layer of the first conductivity type on the first epitaxial layer; the step of forming a trench comprises anisotropically etching through the first and second epitaxial layers to reach within the semiconductor substrate; the step of forming a gate oxide film comprises forming the gate oxide film along an upper surface of the second epitaxial layer and a side wall and bottom surface of the trench; the step of forming a gate comprises etching the polycrystalline silicon layer so that an upper surface thereof is coincident with an upper surface of the first epitaxial layer; and the step of forming a drain layer comprises forming the drain layer in an upper surface of the second epitaxial layer.

* * * * *